United States Patent
Chieco et al.

(10) Patent No.: US 9,374,098 B2
(45) Date of Patent: Jun. 21, 2016

(54) TRANSMITTER SERIALIZER LATENCY TRIM

(71) Applicant: GLOBALFOUNDRIES U.S. 2 LLC, Hopewell Junction, NY (US)

(72) Inventors: Leonard R. Chieco, Hopewell Junction, NY (US); Frank R. Keyser, III, Colchester, VT (US); Michael A Sorna, Hopewell Junction, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 360 days.

(21) Appl. No.: 14/172,550

(22) Filed: Feb. 4, 2014

(65) Prior Publication Data
US 2015/0222376 A1     Aug. 6, 2015

(51) Int. Cl.
| | |
|---|---|
| H04J 3/06 | (2006.01) |
| H03L 7/07 | (2006.01) |
| H04L 7/10 | (2006.01) |
| H04L 7/00 | (2006.01) |
| H03L 7/081 | (2006.01) |
| H03M 9/00 | (2006.01) |
| H04L 1/00 | (2006.01) |
| G06F 1/12 | (2006.01) |

(52) U.S. Cl.
CPC ............... *H03L 7/07* (2013.01); *H03L 7/0814* (2013.01); *H03M 9/00* (2013.01); *H04L 1/00* (2013.01); *H04L 7/0008* (2013.01); *H04L 7/0091* (2013.01); *H04L 7/10* (2013.01); *G06F 1/12* (2013.01)

(58) Field of Classification Search
None
See application file for complete search history.

(56) References Cited

U.S. PATENT DOCUMENTS

| | | | |
|---|---|---|---|
| 6,430,201 B1 | 8/2002 | Azizoglu et al. | |
| 7,006,021 B1* | 2/2006 | Lombaard | H03M 9/00 341/100 |
| 7,366,267 B1 | 4/2008 | Lee et al. | |

(Continued)

FOREIGN PATENT DOCUMENTS

EP    2355398    8/2013

OTHER PUBLICATIONS

Baker, E. "The Design of a CMOS Sensor Camera System for a Nanosatellite" Department of Electric and Electronic Engineering, University of Stellenbosch. Oct. 2006. (143 Pages).

(Continued)

*Primary Examiner* — Jutai Kao
(74) *Attorney, Agent, or Firm* — Yuanmin Cai; Hoffman Warnick LLC (57) ABSTRACT

A system and method for transmitting includes a plurality of multiplexers each configured to combine a pseudo random bit sequence (PRBS) with at least one input stream according to the data control clock. At least one storage device is coupled to an output of each of the plurality of multiplexers and is configured to latch data according to the data control clock. An output multiplexer is coupled to each of the at least one storage device and is configured to select between storage paths according to the data serializer clock. A PRBS checker is configured to compare a PRBS pattern on an output of the output multiplexer with a predicted PRBS pattern. A phase rotator is configured to adjust the data serializer clock based upon the comparison of the PRBS checker to reduce latency of the transmitter.

18 Claims, 4 Drawing Sheets

(56) References Cited

U.S. PATENT DOCUMENTS

| | | |
|---|---|---|
| 8,415,980 B2 | 4/2013 | Fiedler |
| 8,483,344 B2 | 7/2013 | Dillinger |
| 2010/0244913 A1* | 9/2010 | Golding .................. G06F 1/12 327/156 |
| 2011/0191619 A1 | 8/2011 | Morrison et al. |
| 2012/0017118 A1* | 1/2012 | Barakat ................ G06F 11/221 714/37 |
| 2013/0027229 A1 | 1/2013 | Denham |
| 2013/0170591 A1 | 7/2013 | Su |

OTHER PUBLICATIONS

Gui, P. et al. "A Source-Synchronous Double-Data-Rate Parallel Optical Transceiver IC" IEEE Transactions on Very Large Scale Integration (VLSI) Systems, vol. 13, No. 7. Jul. 2005. pp. 833-842.

Manoharan, M. "A High Bandwidth Area Efficient Spatial Divison Multiplexing Based Network on Chip" Department of Electrical & Computer Engineering Faculty of Engineering, National University of Singapore. Nov. 2010. (51 Pages).

* cited by examiner

TRANSMITTER SERIALIZER LATENCY TRIM

CROSS-REFERENCE TO RELATED APPLICATIONS

This application is related to commonly assigned U.S. Application Serial No. 14/172,618, entitled RECEIVER DESERIALIZER LATENCY TRIM, Attorney Docket Number FIS920130233US1 (163-775), filed concurrently herewith, incorporated herein by reference in its entirety.

BACKGROUND

1. Technical Field

The present invention relates to the reduction of latency of a serializer and deserializer, and more particularly to latency trim using pseudo random bit sequence generation and checking for a serializer and deserializer.

2. Description of the Related Art

Serial communication is the process of sending data one bit at a time, sequentially, over a communications channel. A serializer receives parallel data and creates a single stream with N-times the speed. A deserializer receives the serial data and creates a parallel bus of data, N-times the width. The latency of a serializer/deserializer is one of several key performance metrics. Serializer latency is the amount of time from the rising edge of the clock that captures the parallel data into the serializer to the time the first bit is transmitted out of the transmitter. Deserializer latency is the amount of time from the capture of the first bit at the input of the receiver to the rising edge of the clock outputting the parallel data out of the deserializer. Lower latencies are preferable and many designs count on low latency. In the design of a serializer/deserializer, there is a trade-off between minimizing latency and digital timing margin of the constituent latches involved in the serialization.

SUMMARY

A transmitter includes a plurality of multiplexers each configured to combine a pseudo random bit sequence (PRBS) with at least one input stream according to the data control clock. At least one storage device is coupled to an output of each of the plurality of multiplexers and is configured to latch data according to the data control clock. An output multiplexer is coupled to each of the at least one storage device and is configured to select between storage paths according to the data serializer clock. A PRBS checker is configured to compare a PRBS pattern on an output of the output multiplexer with a predicted PRBS pattern. A phase rotator is configured to adjust the data serializer clock based upon the comparison of the PRBS checker to reduce latency of the transmitter.

A transmitter includes a pseudo random bit sequence (PRBS) generator configured to generate a PRBS. A plurality of multiplexers each is configured to combine a pseudo random bit sequence (PRBS) with at least one input stream according to the data control clock. At least one storage device is coupled to an output of each of the plurality of multiplexers and is configured to latch data according to the data control clock. An output multiplexer is coupled to each of the at least one storage device and is configured to select between storage paths according to the data serializer clock. A PRBS checker is configured to compare a PRBS pattern on an output of the output multiplexer with a predicted PRBS pattern. A phase rotator is configured to adjust the data serializer clock based upon the comparison of the PRBS checker to reduce latency of the transmitter by moving the data serializer clocker in time relative to the data control clock.

A method for transmitting includes delaying a data control clock using a phase rotator to provide a data serializer clock. Each of a plurality of input streams is combined with a pseudo random bit sequence (PRBS) using a plurality of multiplexers according to the data control clock. Data output from each of the plurality of multiplexers is latched according to the data control clock. A storage path is selected using an output multiplexer according to the data serializer clock. A PRBS pattern on an output of the output multiplexer is compared with a predicted PRBS pattern. The data serializer clock is adjusted based upon the comparing using a phase rotator to reduce latency of a transmitter These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, systems, methods and computer program product (e.g., simulators) for reducing latency in a transmitter (e.g., serializer) are provided. The present principles provide a means of minimizing the latency of a transmitter serializer by employing a data control clock for driving the latches and a separate data serializer clock for driving the output multiplexer. A pseudo random bit sequence (PRBS) generator is employed to generate a PRBS, which is multiplexed with the input data to create two serial streams at half rate. A PRBS is a sequence that appears to be perfectly random, but repeats with a periodic cycle time. The timing difference between the data control clock and data serializer clock can be controlled via a phase rotator based delay means.

A PRBS checker compares a PRBS pattern from the output of an output multiplexer with a predicted PRBS pattern. An optimal latency can be achieved using PRBS generation/PRBS checking to determine the point in time when latency starts to cause errors. The value of the phase rotator can then be adjusted to delay the data serializer clock in time relative to the data control clock, moving the serializer from this error state by a desired margin.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
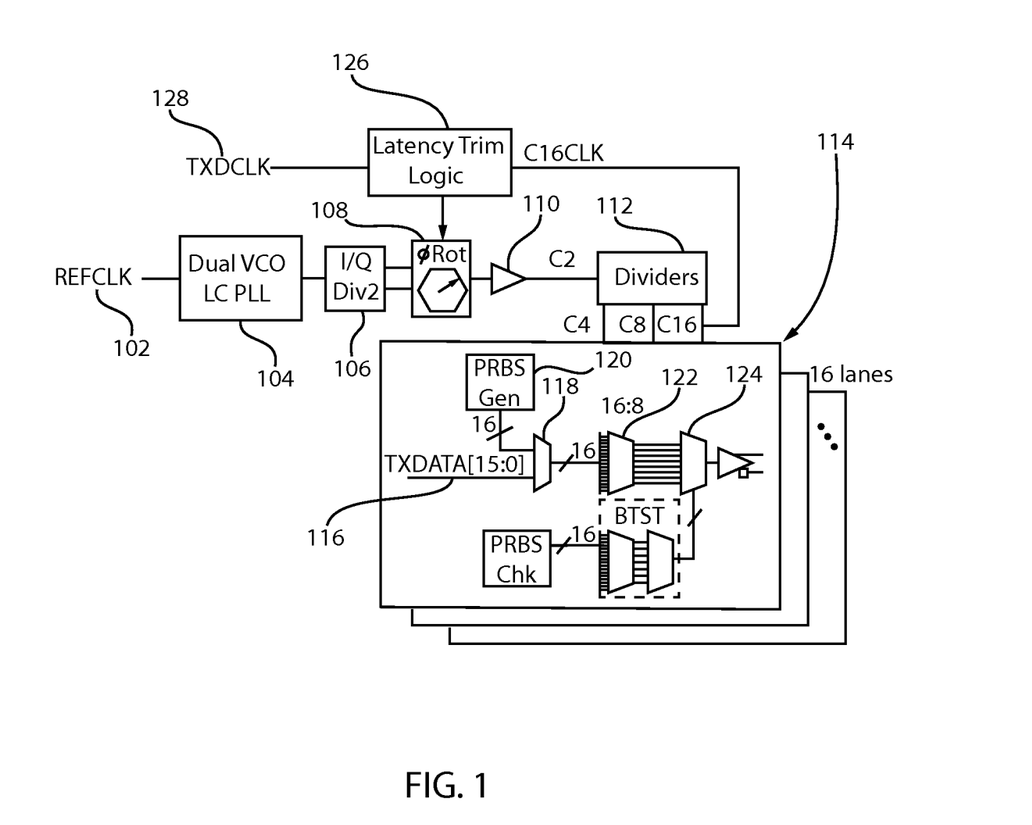
FIG. 1 is a block/flow diagram showing a high-level overview of a transmitter, in accordance with one illustrative embodiment.

Referring now to the drawings in which like numerals represent the same or similar elements and initially to FIG. 1, a block/flow diagram showing a high-level overview of a transmitter 100 is illustratively depicted in accordance with one embodiment. The transmitter 100 preferably includes a serializer. The transmitter 100 receives clock signal REFCLK 102, which is preferably a low frequency signal, e.g., 100-166.66 megahertz (MHz). REFCLK 102 enters a LC voltage controlled oscillator (VCO) based phase-locked loop (PLL) 104 to create a half rate clock C2 using an in-phase and quadrature (I/Q) divider 106. The phase of the output C2 clock can be controlled using the phase rotator 108, which provides a means of interpolating the output phase in 64 steps per clock period. The C2 clock is buffered by buffer 110 and then enters clock dividers 112 to provide the C4, C8 and C16 clocks. In the nomenclature $C_z$, z is the sub rate below the baud rate. For example, C16 is 1/16th the baud rate. At 15 Gb/s, C16=937.5 MHz clock frequency.

The clock dividers 112 feed 16 lanes worth of transmit lanes 114. The parallel data normally comes from the customer via the TXDATA [15:0] input 116. The 2:1 MUX 118 multiplexes TXDATA from the customer with a pseudo random binary sequence (PRBS) from PRBS generator 120. Serialization is performed in two stages, where a 16:8 serializer 122 is performed first in logic, then the final 8:1 serializer 124 is performed in analog.

One of the goals of the transmit serializer latency trim of the present invention is to minimize the latency of the 16:8 serializer 122. Using the latency trim logic 126, the phase rotator 108 is controlled to generate clock C16. The latency trim logic 126 drives clock C16 to line up with TXDCLK 128.

Figure 2:
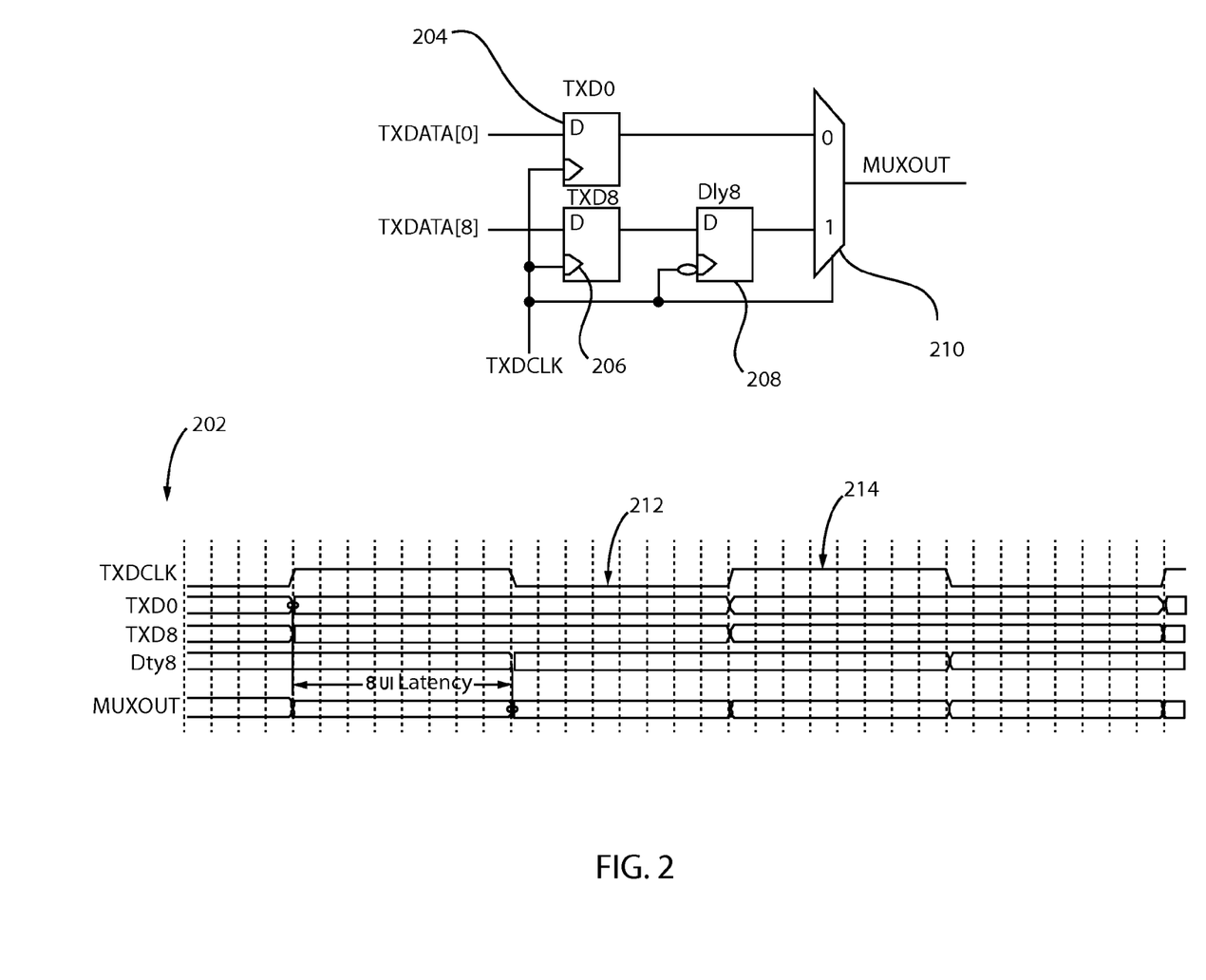
FIG. 2 is a block/flow diagram showing a tree-type 2:1 serializer, in accordance with one illustrative embodiment.

Referring now to FIG. 2, a block/flow diagram shows a tree-type 2:1 serializer 200, in accordance with one illustrative embodiment. The 16:8 serializer 122 in FIG. 1 may be created from eight parallel 2:1 serializers 200. The 2:1 serializer 200 is shown having related timing diagram 202. In this diagram 202, the incoming TXDATA[0] and TXDATA[8] data is clocked on the rising edge of TXDCLK. This example shows two bits of data: TXD0 on latch 204 and TXD8 on latch 206. The TXD8 is also latched 208 a second time with the falling edge of TXDCLK, producing Dly8. The latches 204, 206, 208 hold the data for a full TXDCLK period.

The select line of the MUX 210 is driven from the TXDCLK itself, taking the TXD0 as output when low 212 and TXD8 as output when high 214. With the full TXDCLK width, the output commutates between the two serial streams producing a 2× speed increase in the MUXOUT signal, hence 2:1 serialization. The structure of serializer 200 is conservative in that the MUX selection has about half cycle of delay to avoid timing collision with the TXD0 data transitions. One potential hazard in this design (aside from meeting the basic timing at high rate) is near the end of the cycle. The hold-time of this circuit is easily met if the latch clock-to-Q time (Tcq) delay is longer than the MUX select-to-output delay (Tsq), which is normally the case. The clock-to-Q time is the delay it takes the output of the latch to get to the final one or zero state when the latch clock input changes. The select-to-output delay is the propagation delay of the MUX select line change at the input of the MUX until the time the output data gets to the final one or zero state.

In this conservative design approach, the latency of a half cycle is spent to achieve the timing. However, for low latency operation, this is not desirable. The other option would be to use the opposite phase of TXDCLK for the select line of the MUX 210, placing it earlier in the cycle. While this is feasible, it is difficult to delay the signals to avoid the potential hazard of MUX setup time, especially across process variation. Unlike the previous case, the Tcq being greater than Tsq causes a process varying problem with timing. Additional delay should be added to the MUX select and a potential race condition results. This scheme would minimize the latency at the expense of potential power and timing issues.

An important idea behind latency trim is to provide a means of minimizing the latency by having separate clocks driving the latches and the 2:1 MUX. The optimal value can be actively found using a PRBS generation/PRBS checking routine to determine when latency causes errors (i.e., a fail condition is reached). Finally, a programmable offset can be used to provide sufficient system margin. This will be discussed in more detail with respect to FIG. 3.

Figure 3:
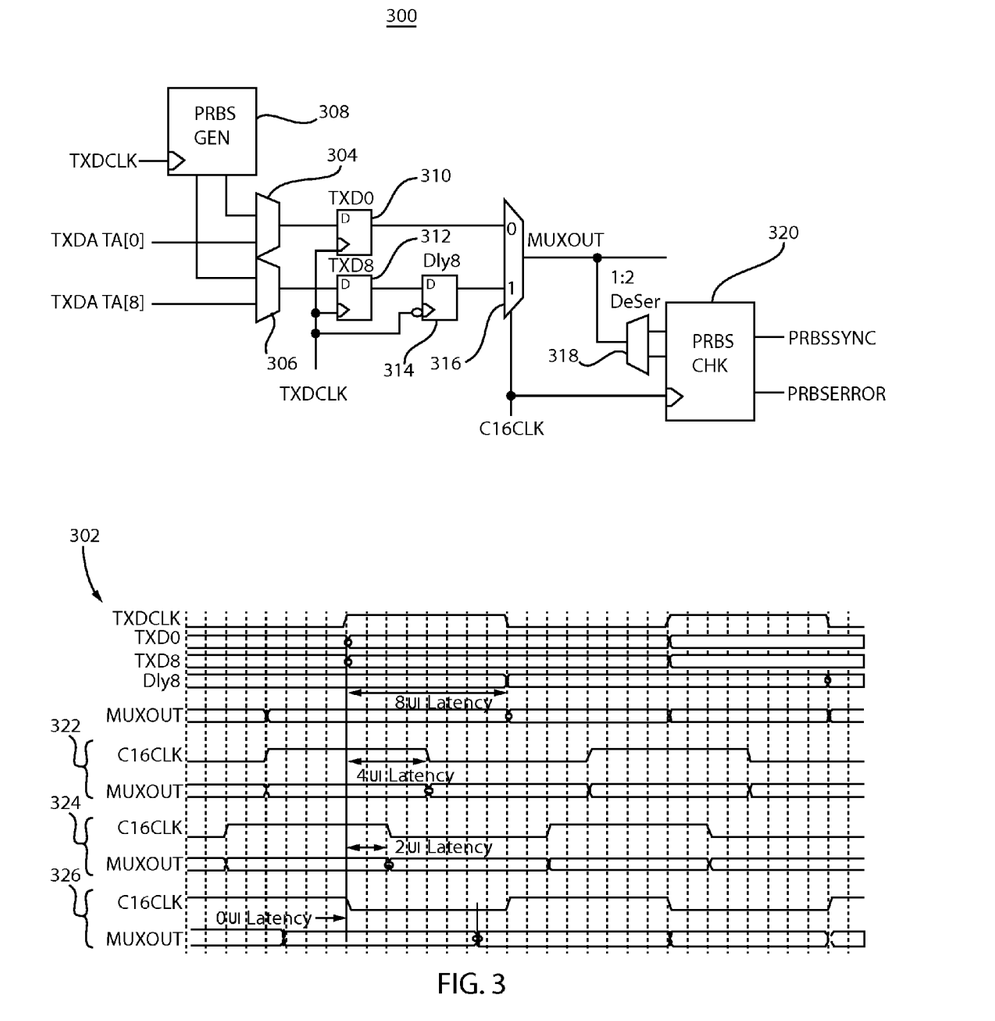
FIG. 3 is a block/flow diagram showing a 2:1 serializer with pseudo random bit sequence generation and checking for the reduction of latency, in accordance with one illustrative embodiment.

Referring now to FIG. 3, a block/flow diagram showing a 2:1 serializer with PRBS generation/checking 300 is illustratively depicted in accordance with one embodiment. The serializer 300 is shown having related timing diagram 302.

Incoming data streams TXDATA[0] and TXDATA[8] is clocked on the rising edge of the data control clock TXDCLK and is received by input MUX 304, 306 respectively. The select line (not shown) of MUX 304, 306 is driven by TXDCLK to combine data streams TXDATA[0] and TXDATA[8] with a PRBS from PRBS generator 308, which is clocked by TXDCLK. A PRBS is a sequence that appears to be perfectly random, but repeats with a periodic cycle time.

The data is latched by storage devices or latches 310, 312 as bits TXD0 and TXD8, respectively. The TXD8 data is also latched 314 a second time with the falling edge of TXDCLK, producing Dly8. The latches 310, 312, 314 hold the data for a full period of the data control clock TXDCLK. The data is combined by output MUX 316. The select line of the output MUX 316 is driven by the data serializer clock C16CLK. A phase rotator delays the data control clock TXDCLK to produce the data serializer clock C16CLK. The data control clock TXDCLK and data serializer clock C16CLK are otherwise decoupled from one another.

The 2:1 serializer 300 modifies the serializer 200 in FIG. 2 in a number of important ways. The select line of the MUX 316 is separated from the data control clock TXDCLK and a data serializer clock C16CLK signal is introduced to drive the MUX 316 selector. The timing difference between these two clocks can be controlled via a phase rotator based delay means, such as shown in FIG. 1. Other important additions include PRBS generator 308, which generates a PRBS to create two serial streams at half rate, and a companion deserializer 318/PRBS checker 320.

The PRBS generator 308 and checker 320 initially start with the phases of the data control clock TXDCLK and the data serializer clock C16CLK lined up (i.e., conservative timing). Note that the PRBS generator 308 is running off of data control clock TXDCLK and the PRBS checker 320 is running off of data serializer clock C16CLK. The PRBS checker 320 is self-priming, where it first acquires a synchronization by using incoming data at some given point as a "seed," then predicts the next few cycles. Once the prediction is valid, the PRBSSYNC signal is raised and from that point on each incoming bit is checked against the predicted value. If there is ever a discrepancy, the PRBSERROR signal is raised and held high until another reset is applied.

With the arbitrary delay skew between TXDCLK and C16CLK, the latency can be selectively dialed down from the error state by moving the data serializer clock C16CLK signal earlier in time (i.e., to the left) relative to the fixed data control clock TXDCLK using the phase rotator, as seen in timing diagram 302. The combination of both PRBS generation 308 and PRBS checking 320 provides a means of assessing where the timing between TXDCLK and C16CLK has been moved too far. The PRBS checking 320 compares a PRBS pattern on an output of MUX 316 with a predicted PRBS pattern. Eventually, the setup time of the MUX 316 will be violated and the PRBS checker 320 will register an error.

It is unacceptable to operate at this error condition. To compensate, the data serializer clock C16CLK is moved back later in time (i.e., to the right) relative to data control clock TXDCLK from this error state by however much margin is desired or needed. Using the same delay skewing means between TXDCLK and C16CLK simply winds back by the setup time margin, Tsu_margin. The setup time margin describes the amount of time the data can arrive before the clock and the latches/flip-flops will capture the appropriate data. In a similar manner, the "hold margin" is tested by moving the C16CLK to the right until failure. Thus, the fail point could be backed off by the amount of the hold time margin, Thd_margin. Hold time margin describes the amount of time after the clock arrives that data is to be held constant. Both Tsu_margin and Thd_margin values may be programmable.

The timing diagram 302 shows how the Latency Trim function is expanded from a 2:1 serializer to the full 16:8 and 8:4 serializer function shown in FIG. 1. The latency is reduced from 8 unit intervals (UI) 322, to 4 UI 324, and finally 0 UI 326. As shown in FIG. 1, the PRBS generation and PRBS checking function is already present to support manufacturing test thus no additional logic is needed to enable the Latency Trim function.

Based on the initial timing of the 8:4 serializer and associated C8/C16 clock relationships, it may be possible to achieve more than 8 UI of savings in latency reduction. It is noted that the output of the MUXOUT is sampled by latches in the 8:4 serializer running in the C8 clock domain. Adequate setup/hold time is built into the clock crossing as part of the base design. Interestingly, any additional latency associated with this clock crossing can also be minimized since the true failure point in the serialization occurs when the C8 latches capture data in the wrong cycle. This would result in PRBS checker error and thus any excess latency can be removed as well.

The transmitter core includes 17 lanes worth of serialization across a 1.5 mm core height span. This leads to the potential for having skew across multiple instances of the lanes. Recall that there is only one centralized clock generating the C2 (and subsequently the C16). The latency trim approach addresses this concern, provided the PRBS checking results are interrogated over the entire 17 lanes. Thus, the decision to move the C16CLK rotator will stem from the "global" PRBS error status (or lack thereof).

The serializer 300 provides a clocking scheme for reducing latency. Advantageously, the PRBS generator 308 and PRBS checking 320 are typically already present to support manufacturing testing. Thus, no additional logic is needed to enable the latency trim function.

Figure 4:
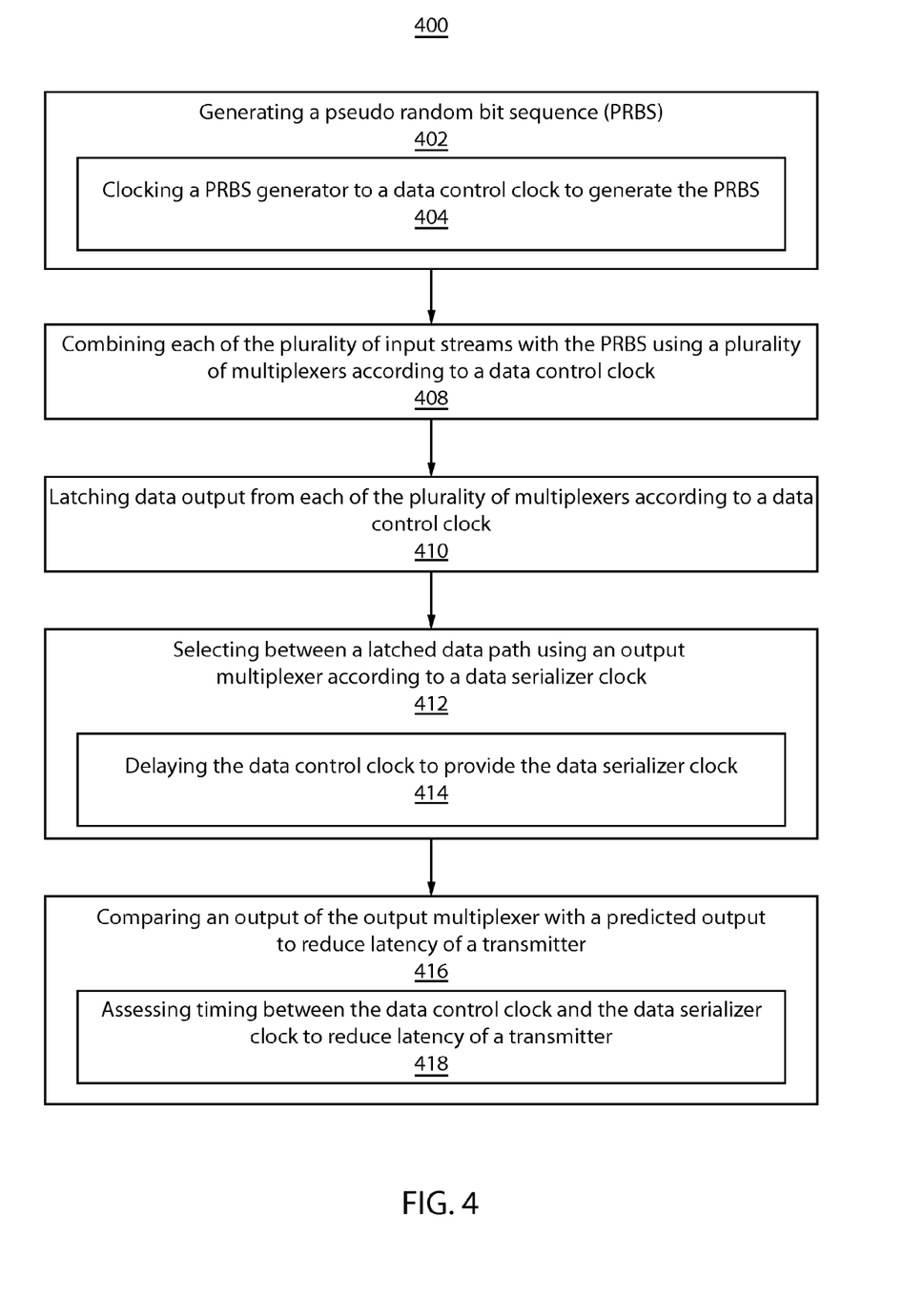
FIG. 4 is a block/flow diagram showing a method for transmitting, in accordance with one illustrative embodiment.

Referring now to FIG. 4, a block/flow diagram showing a method for transmitting 400 is illustratively depicted in accordance with one embodiment. The method 400 may be employed to reduce latency in a transmitter serializer. In one embodiment, the method for transmitting 400 may be embodied in a computer program product, such as, e.g., a simulator.

In block 402, a pseudo random bit sequence is generated. A PRBS is a sequence that appears to be perfectly random, but repeats with a periodic cycle time. A PRBS generator is clocked according to a data control clock to generate the PRBS in block 404. In block 408, each of the plurality of input streams is combined with the PRBS using a plurality of multiplexers according to the data control clock. The plurality of multiplexers provides n serial streams at 1/n rate. In block 410, data from each stream is latched according to the data control clock. This may involve storage devices or latches. In block 412, data streams are selected using an output multiplexer clocked to a data serializer clock. The data control clock is delayed using a phase rotator to provide the data serializer clock in block 414, such that the data control clock and the data serializer clock are otherwise decoupled from one another.

In block 416, PRBS patterns of an output of the output multiplexer are compared with a predicted PRBS pattern to reduce latency of the transmitter. Comparing may involve a PRBS checker, clocked to the data serializer clock, to assess the timing between the data control clock and the data serializer clock in block 418. The PRBS checker is self-priming, where it first acquires synchronization using the incoming data at some point as a seed, then predicts the next few cycles. Where there is a discrepancy, an error signal is raised and held until a reset is applied. Latency of the transmitter can be reduced by adjusting the value of the phase rotator to move the data serializer clock in time relative to the data control clock to move the transmitter from this error state by a desired margin.

Having described preferred embodiments of a system and method for transmitter serializer latency trim (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A transmitter, comprising:
 a plurality of multiplexers each configured to combine a pseudo random bit sequence (PRBS) with at least one input stream according to a data control clock;
 at least one storage device coupled to an output of each of the plurality of multiplexers and configured to latch data according to the data control clock;
 an output multiplexer coupled to each of the at least one storage device and configured to select between storage paths according to a data serializer clock; and
 a PRBS checker configured to compare a PRBS pattern on an output of the output multiplexer with a predicted PRBS pattern; and
 a phase rotator configured to adjust the data serializer clock based upon the comparison of the PRBS checker to reduce latency of the transmitter, wherein the PRBS checker is further configured to assess timing between the data control clock and the data serializer clock.

2. The transmitter as recited in claim 1, wherein the phase rotator is configured to move the data serializer clock in time relative to the data control clock to reduce latency.

3. The transmitter as recited in claim 1, wherein the phase rotator is further configured to delay the data control clock to provide the data serializer clock such that the data control clock and data serializer clock are otherwise decoupled from one another.

4. The transmitter as recited in claim 1, wherein the PRBS checker is configured to raise an error signal until a reset is applied where there is a discrepancy between the PRBS pattern on the output of the output multiplexer and the predicted PRBS pattern.

5. The transmitter as recited in claim 1, wherein the plurality of multiplexers are configured to combine the PRBS with at least one input stream to provide a plurality of n streams at 1/n rate.

6. The transmitter as recited in claim 1, further comprising a PRBS generator configured to generate PRBS and wherein the PRBS generator and each of the at least one storage devices are clocked according to the data control clock.

7. The transmitter as recited in claim 1, wherein the PRBS checker is clocked according to the data serializer clock.

8. The transmitter as recited in claim 1, wherein the PRBS checker is self-priming.

9. The transmitter as recited in claim 1, wherein the PRBS generator and each of the at least one storage devices are clocked according to the data control clock and the PRBS checker is clocked according to the data serializer clock.

10. A transmitter, comprising:
 a pseudo random bit sequence (PRBS) generator configured to generate a PRBS;
 a plurality of multiplexers each configured to combine a pseudo random bit sequence (PRBS) with at least one input stream according to the data control clock;
 at least one storage device coupled to an output of each of the plurality of multiplexers and configured to latch data according to the data control clock;
 an output multiplexer coupled to each of the at least one storage device and configured to select between storage path according to a data serializer clock;
 a PRBS checker configured to compare a PRBS pattern on an output of the output multiplexer with a predicted PRBS pattern; and
 a phase rotator configured to adjust the data serializer clock based upon the comparison of the PRBS checker to reduce latency of the transmitter by moving the data clock in time relative to the data control clock.

11. A method for transmitting, comprising:
 combining each of a plurality of input streams with a pseudo random bit sequence (PRBS) using a plurality of multiplexers according to a data control clock;
 latching data output from each of the plurality of multiplexers according to the data control clock;
 selecting between storage paths using an output multiplexer according to a data serializer clock;
 comparing a PRBS pattern on an output of the output multiplexer with a predicted PRBS pattern; and
 adjusting the data serializer clock based upon the comparing using a phase rotator to reduce latency of a transmitter, wherein comparing includes assessing timing between the data control clock and the data serializer clock.

12. The method as recited in claim 11, where adjusting includes moving the data serializer clock in time relative to the data control clock using the phase rotator to reduce latency.

13. The method as recited in claim 11, further comprising delaying the data control clock to provide the data serializer clock such that the data control clock and data serializer clock are otherwise decoupled from one another.

14. The method as recited in claim 11, wherein comparing includes raising an error signal until a reset is applied where there is a discrepancy between the PRBS pattern on the output of the output multiplexer and the predicted PRBS pattern.

15. The method as recited in claim 11, wherein combining includes combining the PRBS with at least one input stream to provide a plurality of n streams at 1/n rate.

16. The method as recited in claim 11, further comprising generating the PRBS and wherein generating and latching are clocked according to the data control clock.

17. The method as recited in claim 11, wherein the comparing is clocked according to the data serializer clock.

18. The method as recited in claim 11, wherein comparing includes employing a PRBS checker which is self-priming.

* * * * *